United States Patent
Otsubo et al.

(10) Patent No.: US 10,470,350 B2
(45) Date of Patent: Nov. 5, 2019

(54) WORK MACHINE

(71) Applicant: FUJI CORPORATION, Chiryu-shi (JP)

(72) Inventors: Satoru Otsubo, Chiryu (JP); Kazuya Degura, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 185 days.

(21) Appl. No.: 15/569,107

(22) PCT Filed: Apr. 27, 2015

(86) PCT No.: PCT/JP2015/062703
§ 371 (c)(1),
(2) Date: Oct. 25, 2017

(87) PCT Pub. No.: WO2016/174715
PCT Pub. Date: Nov. 3, 2016

(65) Prior Publication Data
US 2018/0116080 A1    Apr. 26, 2018

(51) Int. Cl.
*B23P 19/00* (2006.01)
*H05K 13/04* (2006.01)
(Continued)

(52) U.S. Cl.
CPC .......... *H05K 13/043* (2013.01); *H05K 3/306* (2013.01); *H05K 13/0069* (2013.01);
(Continued)

(58) Field of Classification Search
CPC .. H05K 13/043; H05K 13/0069; H05K 13/04; H05K 3/306; H05K 2203/044;
(Continued)

(56) References Cited

U.S. PATENT DOCUMENTS 4,434,550 A * 3/1984 Wilke ................ H05K 13/0413
29/837
5,092,035 A   3/1992 McMichen et al.
(Continued)

FOREIGN PATENT DOCUMENTS

JP    4-65195 A      3/1992
JP    10-209622 A    8/1998
(Continued)

OTHER PUBLICATIONS

Extended European Search Report dated Apr. 4, 2018 in European Patent Application No. 15890699.0, 42 pages.
(Continued)

*Primary Examiner* — Donghai D Nguyen
(74) *Attorney, Agent, or Firm* — Oblon, McClelland, Maier & Neustadt, L.L.P.

(57) ABSTRACT

A work machine including a flow device for flowing molten solder from under a circuit board, and a backup pin for supporting the circuit board from below while a lead of a leaded component is being inserted into a through-hole, which are moved separately under the circuit board. Thus, when the circuit board needs to be supported, the backup pin can be moved to any position, and when solder needs to be applied, the backup pin can be moved to a position that does not obstruct operation of the flow device. Accordingly, as well as guaranteeing operation of the flow device, it is possible to support the circuit board with the backup pin as required, thus improving practicality of the work machine.

4 Claims, 7 Drawing Sheets

(51) Int. Cl.
*H05K 13/00* (2006.01)
*H05K 3/30* (2006.01)
*H05K 3/34* (2006.01)

(52) U.S. Cl.
CPC ............. *H05K 13/04* (2013.01); *H05K 3/308* (2013.01); *H05K 3/3447* (2013.01); *H05K 3/3468* (2013.01); *H05K 2201/1059* (2013.01); *H05K 2201/10757* (2013.01); *H05K 2201/10878* (2013.01); *H05K 2203/0195* (2013.01); *H05K 2203/044* (2013.01)

(58) Field of Classification Search
CPC . H05K 2203/0195; H05K 2201/10878; H05K 3/3447; H05K 3/308; H05K 3/3468; B23K 1/085; Y10T 29/53174; Y10T 29/53183
USPC .................................... 29/739, 741
See application file for complete search history.

(56) References Cited

U.S. PATENT DOCUMENTS 5,218,753 A * 6/1993 Suzuki ............... H05K 13/0069
29/740
5,313,401 A 5/1994 Kasai et al.
5,560,534 A * 10/1996 Okada ................... B23K 1/085
228/37
2014/0201998 A1 7/2014 Yamashita et al.

FOREIGN PATENT DOCUMENTS

| JP | 2000-223827 A | 8/2000 |
| JP | 2001-036228 A | 2/2001 |
| JP | 2013-161840 A | 8/2013 |
| WO | 2014/045370 A1 | 3/2014 |

OTHER PUBLICATIONS

Office Action dated Sep. 25, 2018 in Japanese Patent Application No. 2017-515305 submitting unedited computer generated English translation only.

International Search Report dated Jul. 21, 2015 in PCT/JP2015/062703 Filed Apr. 27, 2015.

* cited by examiner

WORK MACHINE

TECHNICAL FIELD

The present application relates to a work machine that inserts a lead of an electronic component with a lead into a through-hole formed in a circuit board and that applies solder to the lead.

BACKGROUND ART

When mounting electronic components with a lead into a circuit board, the lead is inserted into a through-hole formed in the circuit board, and then solder is applied to the lead. In the patent literature below, examples are disclosed of a work machine that applies solder to a lead that has been inserted into a through-hole by flowing molten solder towards the lead.

Patent literature 1: JP-A-2001-36228
Patent literature 2: JP-A-H10-209622

Summary Technical Problem

With the work machines disclosed in the above patent literature, a flow device for flowing molten solder is arranged below the circuit board, and the flow device is movable to any position under the circuit board. Also, solder is applied to a lead inserted into a through-hole by molten solder being flowed from the flow device. However, when the tip end of a lead is shaped so as to prevent the lead coming out of the through-hole, when the lead is inserted into the through-hole, there are cases in which pressure must be applied when inserting the lead into the through-hole, and in such cases there is a worry that the circuit board will warp. Therefore, when inserting a lead into a through-hole, it is desirable to support the circuit board from below with a support tool or the like. However, if a support tool is arranged under the circuit board, it is difficult to move the flow device to any position. Thus, there is room for improvement in a work machine that mounts a component with a lead onto a circuit board, and the practicality of a work machine can be improved by performing various improvements. The present disclosure takes account of the above circumstances, and an object thereof is to provide a work machine having high practicality.

Solution to Problem

To solve the above problems, a work machine of the present disclosure includes: a holding device configured to hold an electronic component having a lead and to insert the lead into a through-hole formed in a circuit board; a flow device configured to flow molten solder from under the circuit board towards the lead inserted into the through-hole; a first moving device configured to move the flow device to any position under the circuit board; a support tool configured to support the circuit board from below when the lead is inserted into the through-hole; and a second moving device configured to move the support tool to any position below the circuit board.

Advantageous Effects

With the work machine of the present disclosure, a flow device and a support tool are moved separately under a circuit board. Therefore, when it is necessary to use a support tool, the support tool can be moved to any position, and when it is necessary to use the flow device, the support tool can be moved to a position that does not obstruct operation of the flow device. Thus, as well as guaranteeing operation of the flow device, it is possible to support the circuit board with the support tool as required, thus improving practicality of the work machine.

DESCRIPTION OF PREFERRED EMBODIMENTS

The following describes in detail referring to the figures an example embodiment of the present disclosure.

Configuration of Component Mounter

Figure 1:
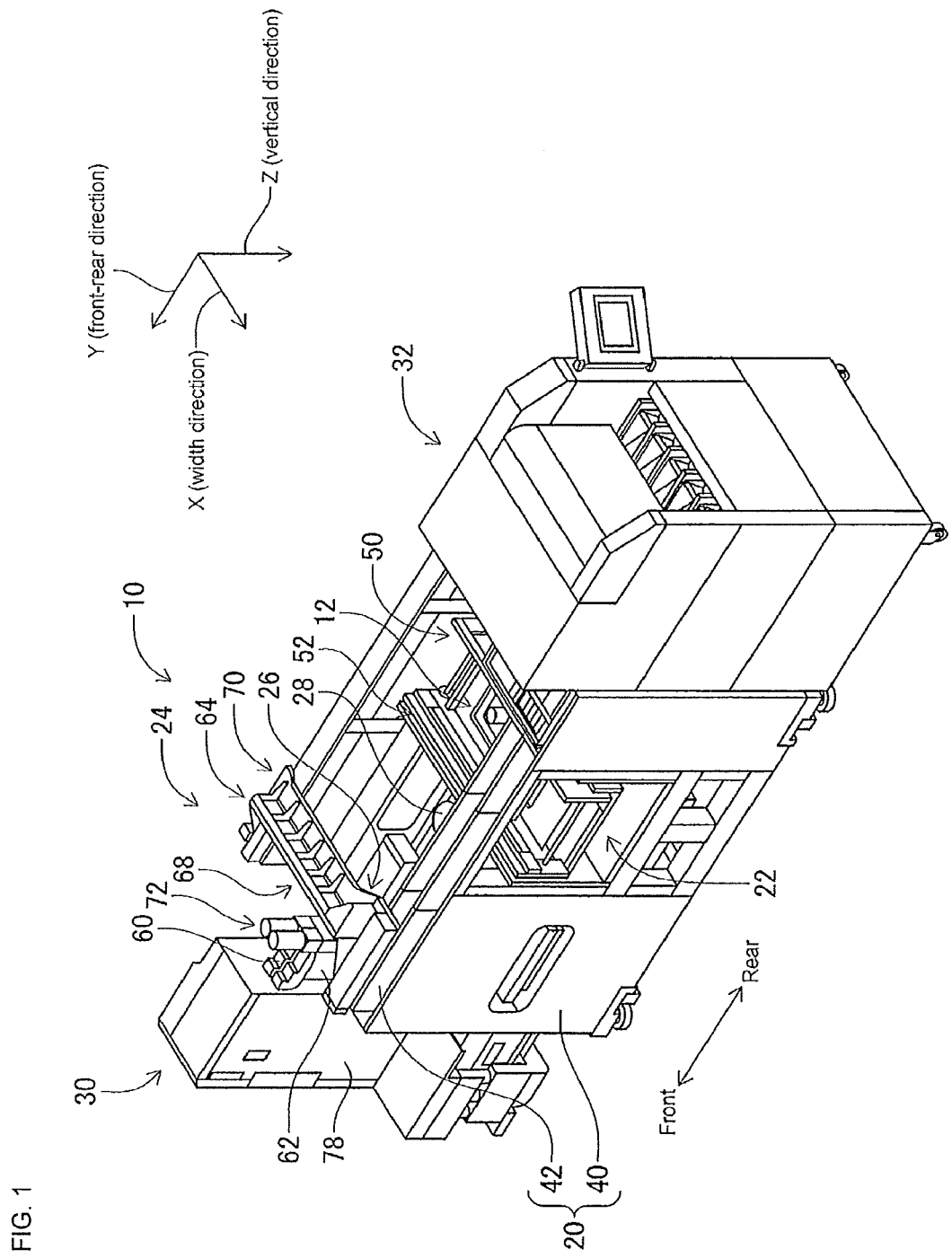
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, solder applying device 34 (refer to FIG. 3), board supporting device 36 (refer to FIG. 3), and control device 38 (refer to FIG. 4). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
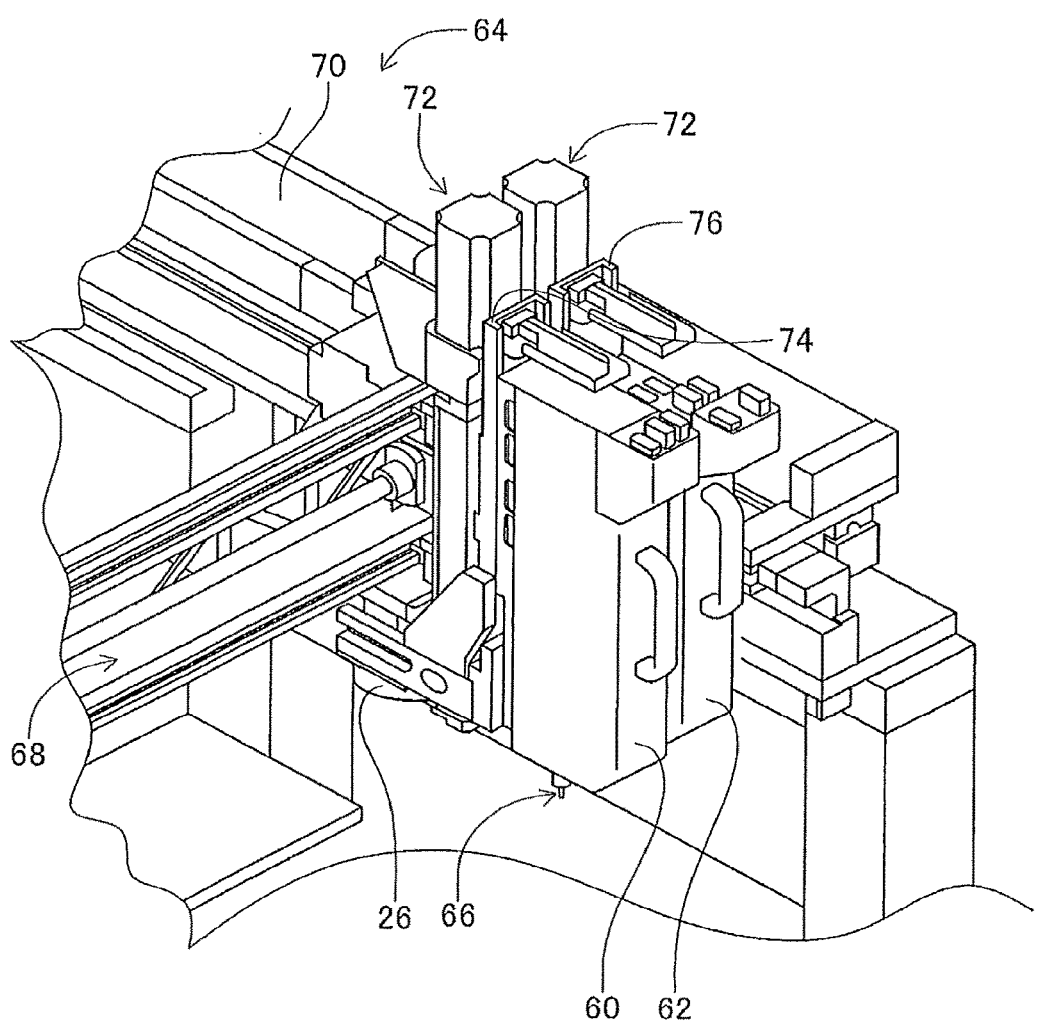
FIG. 2 is a perspective view of a component mounting device of the component mounter.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 4) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Note that, components supplied by component supply device 30 and loose component supply device 32 may include electronic circuit components, configuration components of solar panels, configuration components of power modules, and the like. Also, electronic circuit components include components with leads and components without leads.

Figure 3:
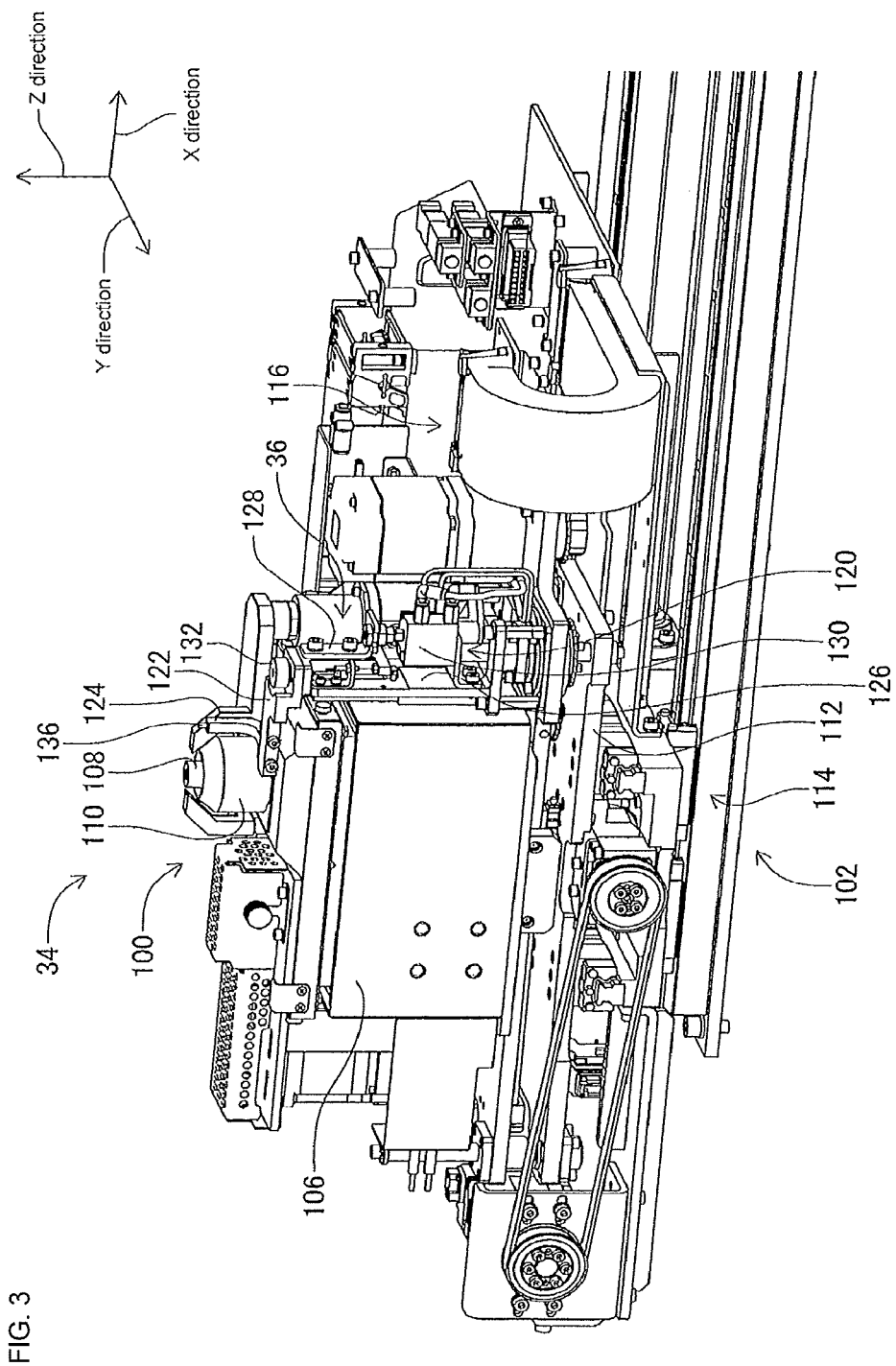
FIG. 3 is a perspective view of a component mounter provided with a solder applying device and a board supporting device.

Solder applying device 34 is arranged below conveyance device 50, and as shown in FIG. 3, includes flow device 100 and flow device moving device 102. Flow device 100 includes solder pot 106, flow nozzle 108, and nozzle cover 110. Solder pot 106 is a roughly rectangular parallelepiped with molten solder stored inside. Flow nozzle 108 is provided at the upper surface of solder pot 106. By operation of a pump (not shown), molten solder is pumped up from solder pot 106, such that molten solder flows upwards from the upper tip of flow nozzle 108. Nozzle cover 110 is roughly cylindrical and is provided at the upper surface if solder pot 106 so as to surround flow nozzle 108. Thus, molten solder that flows from the upper end of flow nozzle 108 passes between the outer circumferential surface of flow nozzle 108 and the inner circumferential surface of nozzle cover 110, and is circulated inside solder pot 106.

Flow device moving device 102 includes slider 112, X-direction moving device 114, Y-direction moving device 116, and a Z-direction moving device (not shown). Slider 112 is roughly plate-shaped and flow device 100 is provided on an upper surface of slider 112. Also, X-direction moving device 114 moves slider 112 in the conveyance direction of circuit board 12 by conveyance device 50, that is, the X direction; Y-direction moving device 116 moves slider 112 in the Y direction. Further, the Z-direction moving device moves slider 112 in the Z direction, that is, the vertical direction. By this, flow device 100 is moved to any position by operation of flow device moving device 102 under conveyance device 50.

Board supporting device 36 is provided on an upper surface of slider 112 of flow device moving device 102 adjacent to flow device 100. Board supporting device 36 includes raising and lowering device 120, attachment member 122, and backup pin 124. Raising and lowering device 120 includes main body section 126, slider 128, and air cylinder 130. Main body section 126 is provided on an upper surface of slider 112 adjacent to solder pot 106 of flow device 100. Note that, a height dimension of main body section 126 is greater than a height dimension of solder pot 106, such that the upper end of main body section 126 protrudes to a higher position than the upper surface of solder pot 106. Also, slider 128 is held to be slidable in a vertical direction from main body section 126. A piston rod (not shown) of air cylinder 130 is connected to slider 128, and slider 128 is moved in the vertical direction by operation of air cylinder 130. Note that, slider 128 is slidably held at an upper end section of main body section 126, and the upper end surface of slider 128 slides in a vertical direction at a position higher than the upper surface of solder pot 106.

Attachment member 122 is roughly rod-shaped, and knurled screw 132 is fixed to the upper end surface of slider 128 at the base section of attachment member 122, such that the tip section protrudes above solder pot 106. Note that, because the upper end surface of slider 128 slides vertically at a position higher than the upper surface of solder pot 106, attachment member 122 is raised and lowered in accordance with the vertical sliding of slider 128 above solder pot 106, but does not contact solder pot 106.

Also, backup pin 124 is roughly L-shaped, and one end of the L-shape is fixed to the end tip section of attachment member 122, with the other end of the L-shape protruding upwards. Note that, cushion section 136 made of resin is attached to the upper end of backup pin 124.

Figure 4:
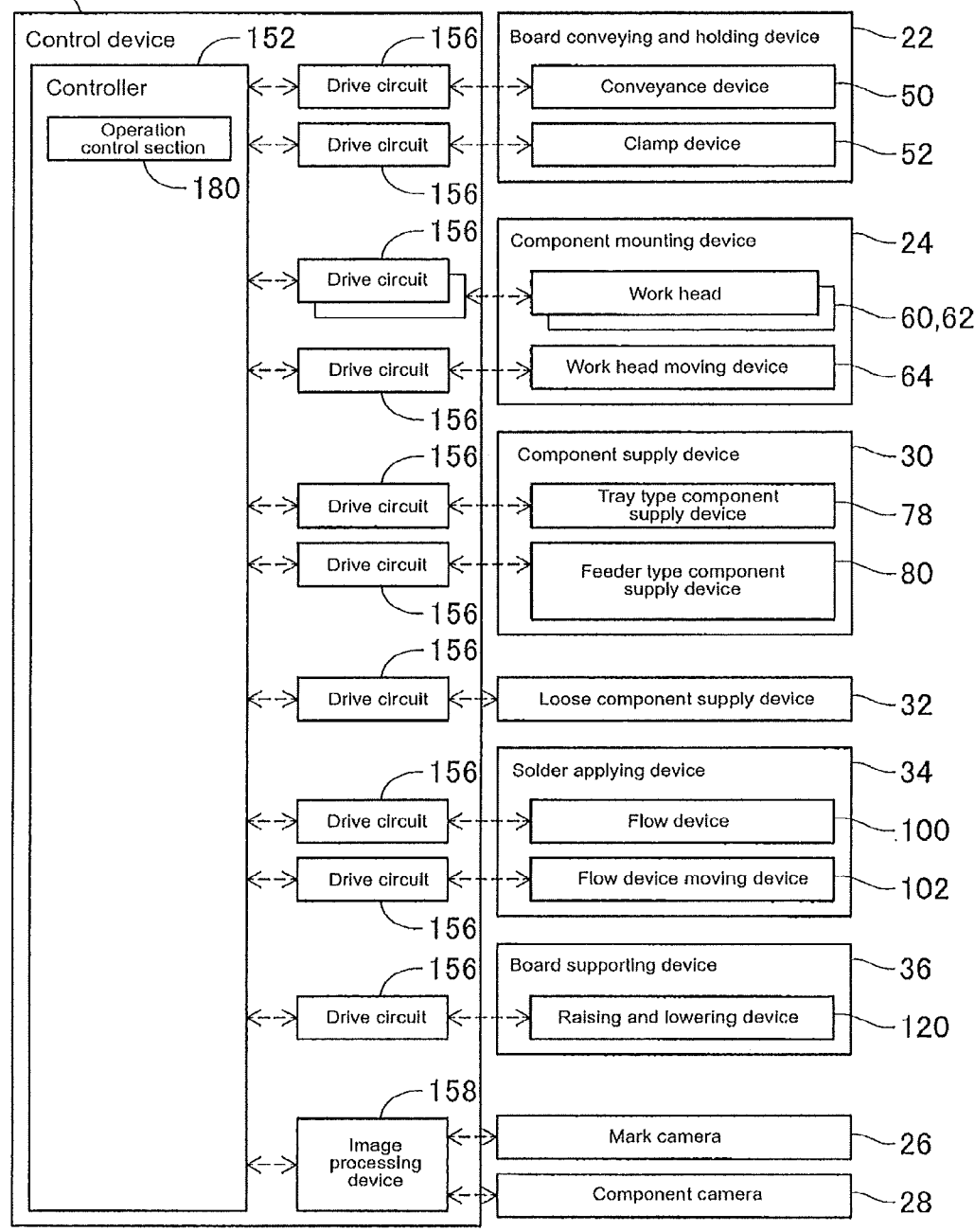
FIG. 4 is a block diagram showing a control device of the component mounter.

As shown in FIG. 4, control device 38 is provided with controller 152, multiple drive circuits 156, and image processing device 158. The multiple drive circuits 156 are connected to conveyance device 50, clamp device 50, work heads 60 and 62, work head moving device 64, tray type component supply device 78, feeder type component supply device 80, loose component supply device 32, flow device 100, flow device moving device 102, and raising and lowering device 120. Controller 152 is provided with a CPU, ROM, RAM, and so on, is formed mainly from a computer, and is connected to the multiple drive circuits 156. By this, operation of board conveying and holding device 22, component mounting device 24, and so on is controlled by controller 152. Further, controller 152 is also connected to image processing device 158. Image processing device 158 is for processing image data acquired by mark camera 26 and component camera 28, and controller 152 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which components with leads (hereinafter also referred to as "leaded component") are mounted on circuit board 12.

Figure 5:
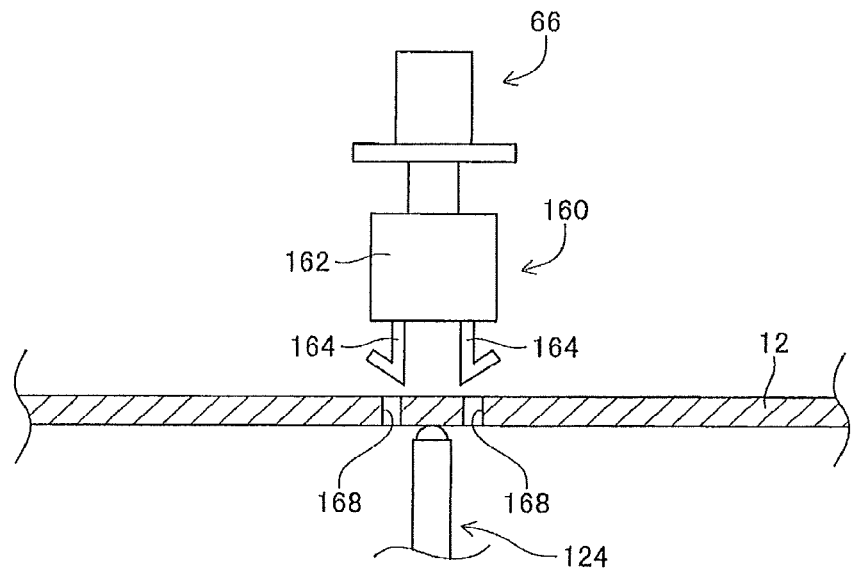
FIG. 5 is a schematic view showing a state in which a lead is being inserted into a through-hole of a circuit board that is supported by a backup pin.

Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Note, as shown in FIG. 5, leaded component 160 is configured from component main body section 162, and two leads 164 protruding from the bottom surface of component main body section 162. Leaded component 160 is picked up and held by a suction nozzle 66 on the surface opposite to the bottom surface of component main body section 162.

Continuing, work head 60 or 62 holding leaded component 160 is moved above component camera 28, and leaded component 160 held by suction nozzle 66 is imaged by component camera 28. Accordingly, information related to the holding position of the component is obtained. Continuing, work head 60 or 62 holding leaded component 160 moves above circuit board 12, and corrects the error in the holding position of circuit board 12 and the error in the holding position of the component and so on. Then, leads 164 of leaded component 160 held by suction nozzle 66 are inserted into through-holes formed in circuit board 12. Here, depending on the shape of the tips of leads 164, mounting work of leaded component 160 is performed according to different methods.

In detail, there are leaded components 160 for which the shape of the tips of leads 164 are designed to prevent the leads from coming out of through-holes 168. For example, as shown in FIG. 5, there are leaded components 160 for which the tips of leads 164 are bent at a sharp angle. When inserting such leads 164 into through-holes 168, it is necessary to apply pressure when inserting the leads 164 into the through-holes, and there is a worry that circuit board 12 will warp due to the sliding resistance that occurs between the leads 164 and the through-holes. Therefore, before inserting the leads 164 into the through-holes 168, board supporting device 36 is moved below the through-holes 168, and backup pin 124 is raised by operation of raising and lowering device 120. By this, because circuit board 12 is supported from below by backup pin 124, even in a case in which pressure is applied when inserting leads 164 into through-holes 168, it is possible to prevent warping of circuit board 12. Note that, when the bent section of the tip of lead 164 is inserted into through-hole 168, the bent portion elastically deforms so as to be inserted into through-hole 168. Then, the bent section of the tip of lead 164 that was elastically deformed returns to its original shape after passing to the underside of circuit board 12.

Figure 6:
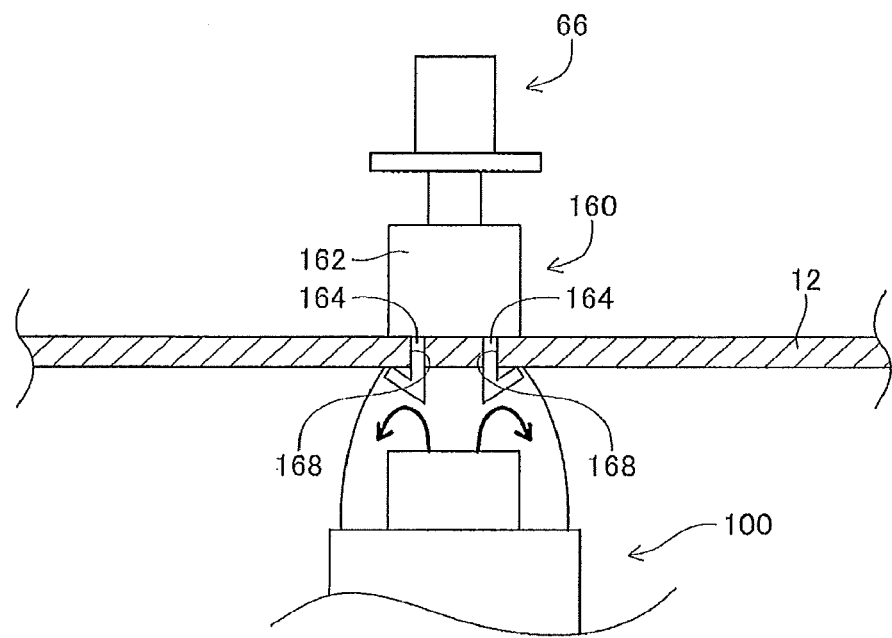
FIG. 6 is a schematic view showing a state in which molten solder is being flowed towards a lead inserted into a through-hole of a circuit board.

When leads 164 have been inserted into through-holes 168, backup pin 124 is lowered by operation raising and lowering device 120. Continuing, as shown in FIG. 6, flow device 100 is moved below through-holes 168 into which leads 164 have been inserted. Then, molten solder is flowed towards the leads 164 inserted into through-holes 168 by being flowed by flow device 100. Thus, solder is applied to circuit board 12 with leaded components 160 in a state with leads 164 inserted into through-holes 168.

In such a manner, with component mounter 10, in a case in which the tips of leads 164 are shaped so as to prevent the lead coming out, warping of circuit board 12 is prevented by leads 164 being inserted into through-holes 168 in a state in which circuit board 12 is supported by backup pin 124.

However, if circuit board 12 is supported by backup pin 124 each time a lead 164 is inserted into a through-hole 168, the cycle time will increase. Therefore, with component mounter 10, in a case in which the tips of leads 164 are not shaped so as to prevent the lead coming out, mounting work is performed without circuit board 12 being supported by backup pin 124.

Figure 7:
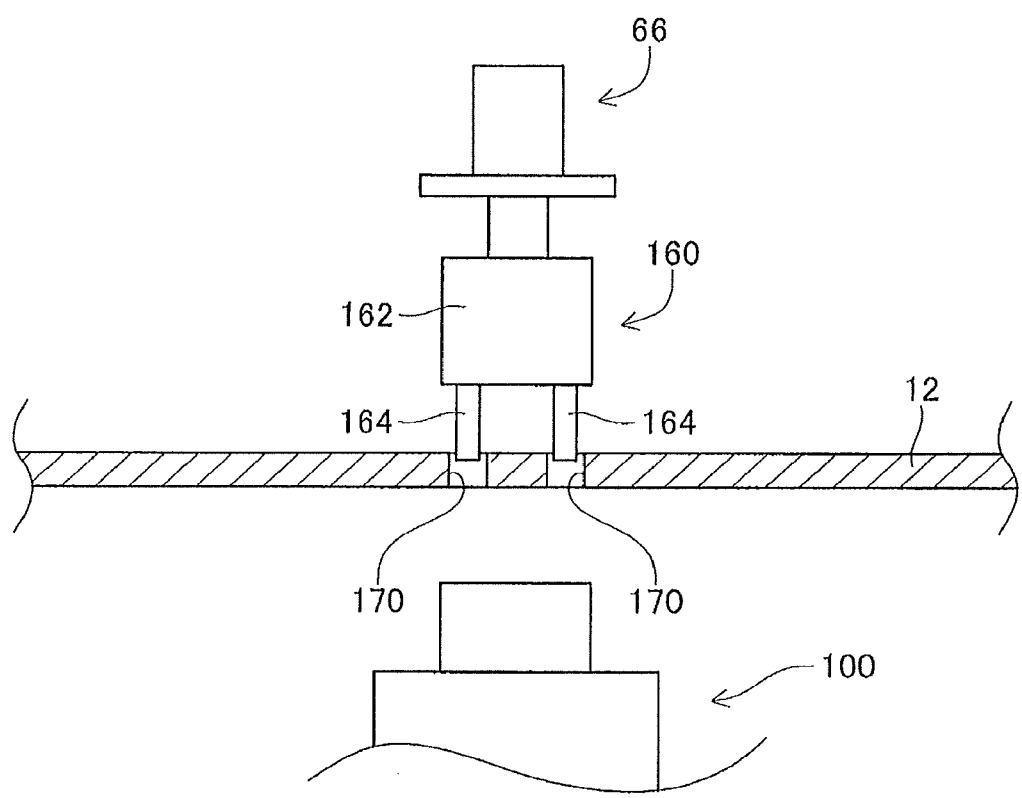
FIG. 7 is a schematic view showing a state in which a lead is being inserted into a through-hole of a circuit board that is not supported by a backup pin.
Figure 8:
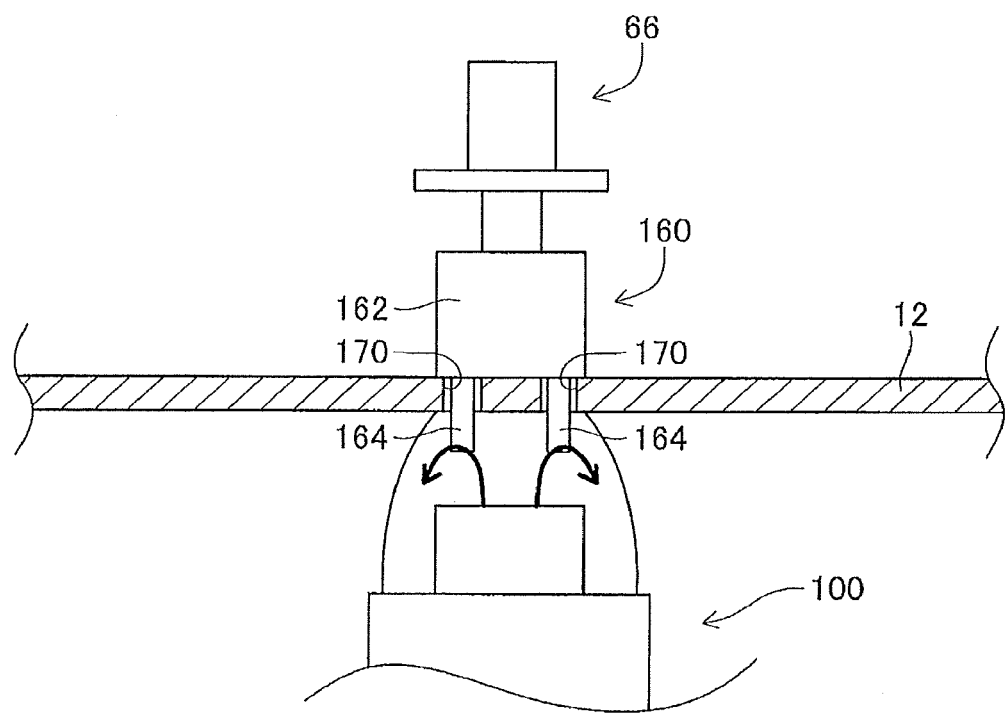
FIG. 8 is a schematic view showing a state in which molten solder is being flowed towards a lead inserted into a through-hole of a circuit board.

In detail, as shown in FIG. 7, when leads 164 for which the tips are not shaped so as to prevent the lead coming out are inserted into through-holes 170, backup pin 124 is lowered by operation of raising and lowering device 120, such that circuit board 12 is not supported by backup pin 124. Then, leads 164 of leaded component 160 held by suction nozzle 66 are inserted into through-holes 170 of circuit board 12 that is not being supported by backup pin 124. Note that, when leads 164 are being inserted into through-holes 170, flow device 100 is moved below through-holes 170. Then, as shown in FIG. 8, after leads 164 have been inserted into through-holes 170, molten solder is flowed towards the leads 164 inserted into through-holes 170 by being flowed by flow device 100. In such a manner, the cycle time is reduced because circuit board 12 is not being supported by backup pin 124.

In such a manner, with component mounter 10, because it is possible to raise and lower backup pin 124, it is possible to support circuit board 12 using backup pin 124 during component mounting only for cases in which there is a worry that circuit board 12 will warp, whereas in cases in which circuit board 12 is unlikely to warp during component mounting, leads 164 are inserted into through-holes 170 and solder is applied by molten solder being flowed without using backup pin 124. Thus, it is possible to guarantee that warping of circuit board 12 will be prevented during component mounting while preventing the cycle time from increasing.

Further, because the above mounting operation causes solder and so on to adhere to backup pin 124, it is necessary to perform cleaning of backup pin 124, but cleaning of backup pin 124 inside component mounter 10 is difficult.

Considering this point, attachment section 122 to which backup pin 124 is fixed is attached to slider 128 using knurled screw 132. Thus, an operator can remove attachment section 122 from slider 128 without using any tools, and perform cleaning of backup pin 124 outside of component mounter 10.

Note that, controller 152 of control device 38, as shown in FIG. 4, includes operation control section 180. Operation control section 180 is a functional section that selectively performs mounting work of inserting 164 into through-hole 170 while using backup pin 124 and then flowing molten solder towards the lead 164, and mounting work of inserting lead 164 into through-hole 170 without using backup pin 124 and then flowing molten solder towards the lead 164.

Further, in the above descriptions, mounting work of applying solder to a circuit board 12 with a single leaded component 160 is described, but solder may be applied to a circuit with multiple leaded components 160 all together. In detail, each of the leads 164 of multiple leaded components 160 may be inserted into through-holes 168 and 170 corresponding to the respective leaded components 160. Here, when inserting leads 164 for which the tips are shaped so as to prevent the lead coming out into through-holes 168, circuit board 12 is supported by backup pin 124. On the other hand, when inserting leads 164 for which the tips are not shaped so as to prevent the lead coming out into through-holes 168, circuit board 12 is not supported by backup pin 124. Then, after each of the leads 164 of multiple leaded components 160 has been inserted into through-holes 168 and 170 corresponding to the respective leaded components 160, molten solder is flowed by flow device 100 consecutively towards the leads 164 inserted into each of the through-holes 168 and 170.

Note that, when molten solder is flowed by flow device 100, of course, backup pin 124 is lowered by operation of raising and lowering device 120. Thus, it is possible to apply solder to a circuit board 12 with multiple leaded components 160 all together.

Note that, component mounter 10 is an example of a work machine. Control device 38 is an example of a control device. Mounting heads 60 and 62 are examples of a holding device. Flow device 100 is an example of a flow device. Flow device moving device 102 is an example of a first moving device, and a second moving device that is a horizontal direction moving device. Backup pin 124 is an example of a support tool. Raising and lowering device 120 is an example of a raising and lowering device of the second moving device. Operation control section 180 is an example of an operation control section.

Further, the present disclosure is not limited to the above example embodiments, and various changed or improved methods of embodiment are possible based on the knowledge of someone skilled in the art. Specifically, for example, with component mounter 10 of an embodiment above, flow device 100 and board supporting device 36 are moved to any position by flow device moving device 102, but flow device 100 and board supporting device 36 may be moved to any position by separate moving devices. That is, two moving devices may be provided, a dedicated moving device for moving flow device 100, and a dedicated moving device to moving board supporting device 36.

Also, in an embodiment above, a bend with a sharp angle was used as a shape of a tip of lead 164 so as to prevent the lead coming out, but the tip of lead 164 may be made thick as a way to prevent the lead 164 coming out.

REFERENCE SIGNS LIST

10: component mounter (work machine); 38: control device; 60, 62: work head (holding device); 100: flow device; 102: flow device moving device (first moving device) (horizontal direction moving device); 124: backup pin (support tool); 120: raising and lowering device; 180: operation control section

The invention claimed is:

1. A work machine comprising:
a holding device configured to hold an electronic component having a lead and to insert the lead into a through-hole formed in a circuit board;
a flow device configured to flow molten solder from under the circuit board towards the lead inserted into the through-hole;
a first moving device configured to move the flow device to any position under the circuit board;
a support tool configured to support the circuit board from below when the lead is inserted into the through-hole; and
a second moving device configured to move the support tool to any position below the circuit board.

2. The work machine according to claim 1, wherein the second moving device includes
a raising and lowering device configured to raise and lower the support tool under the circuit board, and
a horizontal direction moving device configured to move the support tool to any position on a horizontal plane that is perpendicular to a movement direction of the support tool due to the raising and lowering device,
wherein
the first moving device and the horizontal direction moving device are the same device, and
the first moving device moves the flow device to any position on the horizontal plane.

3. The work machine according to claim 2, further comprising:
a control device configured to control operation of each of the holding device, the flow device, the first moving device, and the second moving device,
wherein
the control device includes an operation control section configured to selectively perform
a first mounting work of mounting the electronic component on the circuit board by using the flow device to flow molten solder towards the lead inserted into the through-hole, after the lead has been inserted into the through-hole in a state with the circuit board supported from below by the support tool, and
a second mounting work of mounting the electronic component on the circuit board by using the flow device to flow molten solder towards the lead inserted into the through-hole, after the lead has been inserted into the through-hole in a state without the circuit board supported from below by the support tool.

4. The work machine according to claim 1, further comprising:
a control device configured to control operation of each of the holding device, the flow device, the first moving device, and the second moving device,
wherein
the control device includes an operation control section configured to selectively perform
a first mounting work of mounting the electronic component on the circuit board by using the flow device to flow molten solder towards the lead inserted into the through-hole, after the lead has been inserted into the through-hole in a state with the circuit board supported from below by the support tool, and
a second mounting work of mounting the electronic component on the circuit board by using the flow device to flow molten solder towards the lead inserted into the through-hole, after the lead has been inserted into the through-hole in a state without the circuit board supported from below by the support tool.

\* \* \* \* \*